United States Patent [19]

Finger

[11] 4,139,896

[45] Feb. 13, 1979

[54] METHOD AND APPARATUS FOR PRODUCING NONLINEAR INTEGRAL FUNCTIONS

[75] Inventor: Eugene P. Finger, Brewster, N.Y.

[73] Assignee: Curtis Instruments, Inc., Mount Kisco, N.Y.

[21] Appl. No.: 701,887

[22] Filed: Jul. 1, 1976

Related U.S. Application Data

[62] Division of Ser. No. 538,465, Jan. 3, 1975, abandoned.

[51] Int. Cl.[2] ........................ G06G 7/18; G01R 11/44

[52] U.S. Cl. .................................... 364/829; 307/229; 324/94; 364/483; 364/857

[58] Field of Search ................. 320/9, 39, 48; 324/94; 307/311, 229; 364/850, 829, 483; 235/92

[56] References Cited

U.S. PATENT DOCUMENTS

| | | | |
|---|---|---|---|
| 3,255,413 | 6/1966 | Marwell et al. | 324/94 |
| 3,329,882 | 7/1967 | Sobel | 324/94 |
| 3,421,067 | 1/1969 | Wilson et al. | 324/94 |
| 3,502,983 | 3/1970 | Ingle et al. | 364/850 |
| 3,612,979 | 10/1971 | Roth | 320/39 |
| 3,652,945 | 3/1972 | Nakane et al. | 328/150 |
| 3,704,431 | 11/1972 | Finger | 324/94 |
| 3,704,432 | 11/1972 | Finger | 324/94 |
| 3,710,225 | 1/1973 | Herzig | 320/9 |
| 3,723,769 | 3/1973 | Collins | 307/311 |
| 3,896,301 | 7/1975 | Resta | 307/229 |
| 3,940,735 | 2/1976 | Kronenberg | 235/92 DN |

FOREIGN PATENT DOCUMENTS

| | | |
|---|---|---|
| 853835 | 1970 | Canada. |

*Primary Examiner*—Felix D. Gruber
*Attorney, Agent, or Firm*—Pennie & Edmonds

[57] ABSTRACT

An integrator system is disclosed which incorporates a feedback control loop to vary the linearity of the integrator's response. In the preferred embodiment an electrochemical coulometer is used which stores the integral of a current that is passed through it. Control is achieved by feeding back a control signal from the integrating circuit output to vary the rate at which current is passed through the coulometer.

16 Claims, 3 Drawing Figures

% CAPACITY
OVER-CHARGE REJECTOR
DETECTOR
REJECTOR
END OF SCALE
BEGINNING OF SCALE
AMP
OSCILLATOR
LOW CHARGE WARNING
NON ESSENTIAL CIRCUITS
LOW CHARGE DETECTOR
ESSENTIAL CIRCUITS
BATTERY
22

METHOD AND APPARATUS FOR PRODUCING NONLINEAR INTEGRAL FUNCTIONS

This is a division of application Ser. No. 538,465, filed Jan. 3, 1975 and now abandoned.

BACKGROUND OF THE INVENTION

This concerns a method and apparatus for producing nonlinear integral functions. It is particularly useful with electrochemical integrating devices known as coulometers and more specifically with coulometer-type instruments that are capable of measuring and indicating the total electric current that has been conducted through an electrical circuit.

Coulometers are described in detail in Lester Corrsin's U.S. Re. Pat. No. 27,556 entitled "Operating Time Indicator" and Curtis Beusman's U.S. Pat. No. 3,193,763 entitled "Electrolytic Coulometric Current Integrating Device," both of which are incorporated herein by reference.

The device described in these patents includes a tubular body of nonconductive material having a bore therethrough that supports two columns of a liquid metal such as mercury. The adjacent innermost ends of these columns are separated by a small volume of electrolyte with which they make conductive contact. The outermost ends of the liquid metal columns contact conductive leads that connect the instrument to the source of electric current that is to be measured. In accordance with Faraday's Law, when current flows through the instrument, liquid metal is electroplated from the anode column to the cathode column causing the anode to decrease in length and the cathode to increase an equal amount, the change in column length being directly proportional to the total electric charge passed through the instrument.

Readout of the total current through the instrument may be made by comparing the length of a column against a calibrated scale. Typical visual readout devices are described in the above-identified Corrsin patent and in Beusman's U.S. Pat. No. 3,343,083 entitled "Nonself-Destructive Reversible Electrochemical Coulometer." It has also been found that the coulometer may be read out electrically by measuring changes in the capacitance between the mercury columns and an electrode surrounding the tubular body. The details of such a readout device are set forth in Edward Marwell and Curtis Beusman's U.S. Pat. No. 3,255,413 entitled "Electro-Chemical Coulometer Including Differential Capacitor Measuring Elements" and Eugene Finger's U.S. Pat. Nos. 3,704,431 and 3,704,432 entitled "Coulometer Controlled Variable Frequency Generator" and "Capacitive Coulometer Improvements," respectively, all of which are incorporated herein by reference.

SUMMARY OF THE INVENTION

In a number of situations it may be desirable to vary the linearity with which an integrating device is advanced. For example, in a vehicle battery state of charge monitoring system, it may be desired to increase the rate at which the integrating device is advanced at the beginning or end of the integrating cycle. In systems of this type, absent a feedback path, the display of state of charge would be linear. Nonlinearity would have a number of useful results. Rapid advancement of the coulometer at the end of the integrating cycle would result in an expanded scale at the end of the cycle on any display device, such as a meter, used to read the output of the coulometer. This would thus give the operator a relatively more precise indication of the state of charge of the battery during the critical period before complete discharge. It may also be desired to advance the coulometer rapidly at the beginning of the cycle. This would have the desirable effect of making a significant use (e.g., 20 percent of full capacity) of the battery very apparent. The non-linearity could be such as to cause the integrator and display circuitry to show a half scale reading. This would indicate clearly to a prospective user that the battery is not freshly charged and that a different battery should be used if a full measure of work is to be performed.

By way of example the invention is described in conjunction with a system for maintaining control over the state of charge of a battery in a single or more commonly a plurality of battery powered vehicles, each of which may include various battery powered tools, such as fork lifts or the like. Each vehicle is also provided with circuitry for displaying the state of charge of the battery. The display of this information is made by a conventional electric meter which is calibrated in terms of percentage charge remaining in the battery. The display is similar to a display showing the fuel remaining in a conventional gasoline powered vehicle and is, therefore, quite easy for an operator familiar only with gasoline powered vehicles to read and understand. The system is also provided with a low charge detector, which when the remaining charge in the battery has been depleted below a predetermined level, disables the various tools on the vehicle, leaving only those systems that are essential for the operator to be able to return to a battery charging station.

In the preferred embodiment of the invention, the state of charge of the battery is monitored by an electrochemical coulometer in a module which is connected to the vehicle during operation. A small amount of the current flowing from the battery bypasses a calibrated shunt and is directed to the coulometer. The coulometer thus records the extent to which the battery charge has been depleted. This is sensed by a detection circuit inside the module. The detection circuit drives the electric meter in the vehicle that serves as the state of charge display (i.e., the fuel indicator). The output of the detection circuit is also coupled to the low charge detector which disables nonessential electrical circuits. The module is also provided with a deep discharge rejection circuit which prevents the coulometer from being overdriven. When battery discharge is unusually deep, this circuit passes a current through the coulometer equal in magnitude and opposite in direction to that coming from the shunt, thereby resulting in a net current of zero through the coulometer, zero voltage across the coulometer, and the prevention of further integration.

At the charging station, the battery and its associated module may be removed from the vehicle and plugged into charging equipment. This equipment comprises a battery charger and a meter for displaying the state of charge of the battery as recorded and detected by the coulometer module. While the battery is being recharged, a small amount of the charging current is diverted from the calibrated shunt to the coulometer. Thus, the coulometer in the module is reset along with the battery, thereby insuring that the module reflects the state of charge of the battery associated with it. The fully charged battery, along with its associated module, is then returned to the vehicle. The battery charging station is also provided with circuitry which monitors the state of the coulometer and disconnects the charger when the battery has been fully charged. If for some reason the charger is not disconnected, an overcharge rejection circuit in the module prevents the coulometer from being overdriven. This circuit causes an electric current equal in magnitude and opposite in direction to that produced by the shunt to flow through the coulometer, resulting in a net current of zero through the coulometer, thereby preventing the advancement and damage of the coulometer.

DETAILED DESCRIPTION OF THE PREFERRED EMBODIMENT

Figures 1, 3:
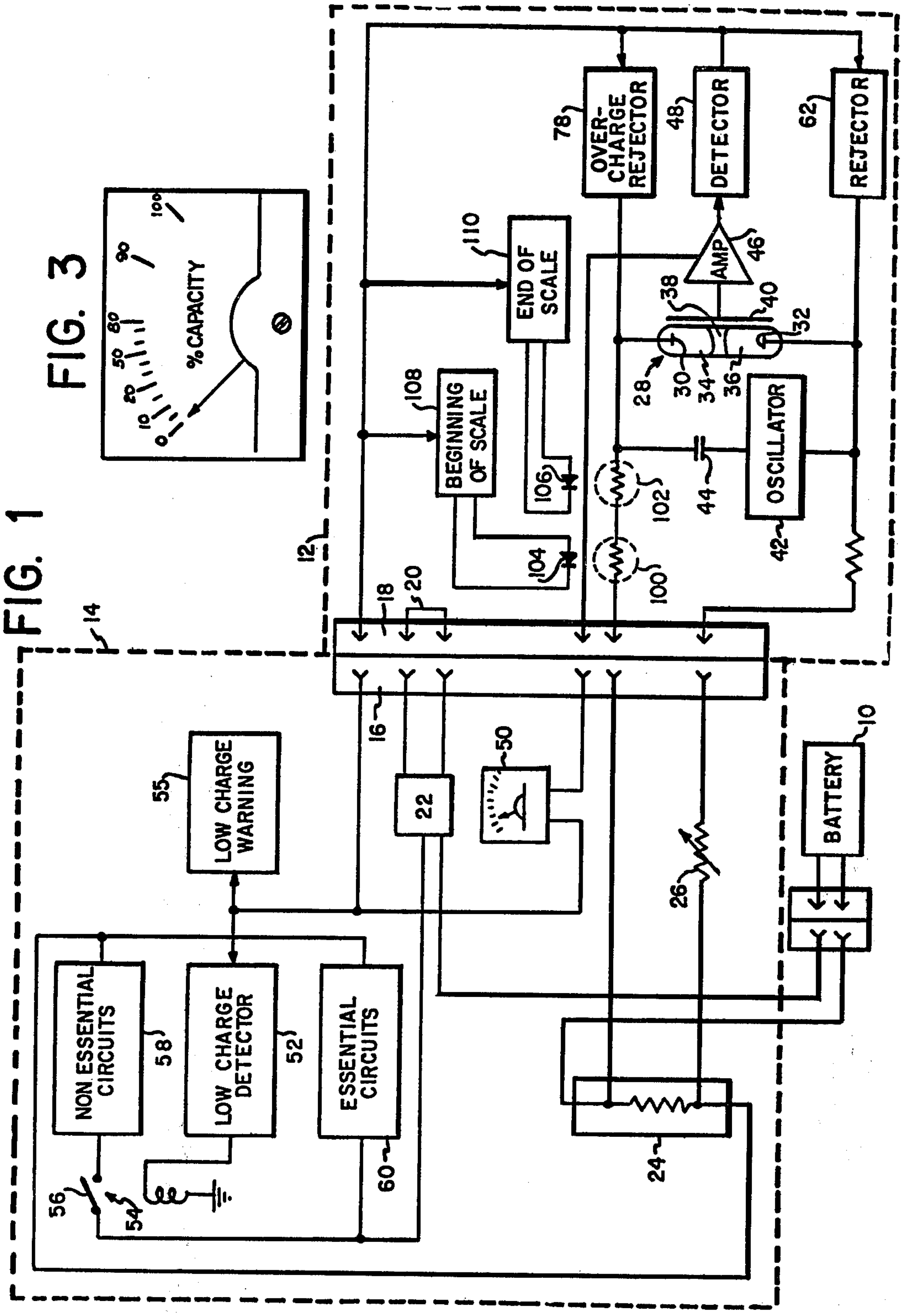
FIG. 1 is a schematic illustration in block diagram form of an illustrative electrical power system of a vehicle provided with a battery state of charge monitoring system using the present invention.
FIG. 3 shows a typical calibration scale on the face of a meter to be used in conjunction with the system of the present invention.

Referring to FIG. 1, the vehicle is supplied with power by an electrical storage battery 10 which is connected to the electrical power system of the vehicle by a suitable connector. Associated with battery 10 is a coulometer module 12. Module 12 is shown connected to vehicle control system 14 by connector 16 in vehicle control system 14 and connector 18 in the module. The module includes a loop 20 which, when module 12 is plugged into the system, acts to complete the electrical circuit through control circuit 22, thereby serving as an interlock. Circuit 22 acts as a switch in series with the battery. Current flowing through the electrical system flows through a shunt resistor 24, which can be any resistor of relatively low value or a calibrated length of wire in the system. As current flows through the system, a small amount of the current passing through the system is sent via a variable resistor 26 and a pair of photoresistive devices 100 and 102 to a coulometer 28 in the module. This current serves the function of advancing the coulometer at a rate dependent upon the value of variable resistor 26 and photoresistive devices 100 and 102.

The coulometer comprises a pair of electrodes 30 and 32 at opposite ends of a capillary tube. Columns of mercury 34 and 36 are in contact with electrodes 30 and 32 respectively. The space between the columns of mercury is filled with an electrolyte 38. As current passes through the module during use of the battery, mercury is transferred unidirectionally from the column at the anode of the coulometer to that at the cathode. Thus, the length of columns 34 and 36 adjacent the two electrodes 30 and 32 is an indication of the amount of charge remaining in the battery. In particular, as the charge in battery 10 is depleted, the length of the mercury column in contact with electrode 30 will be proportional to the charge remaining in the battery. The rate at which the coulometer is advanced may be varied for batteries of different capacity by proper adjustment of resistor 26.

As explained in the above-referenced U.S. Pat. Nos. 3,255,413, 3,704,431 and 3,704,432, the coulometer may be read out electrically by measuring changes in the capacitance between an electrode surrounding the capillary tube of the coulometer and the mercury columns as the columns change in length. An electrode 40 is provided by a thin metal film surrounding the coulometer tube. Readout is provided by an oscillator 42 that produces a high frequency signal which is coupled to electrode 30 by capacitor 44. The capacitance between mercury column 34 and electrode 40 is proportional to the length of column 34. Thus, the efficiency with which the AC signal is coupled to electrode 40 and the magnitude of that signal at the electrode is also proportional to the length of column 34. The signal present at electrode 40 is coupled to an amplifier 46 which amplifies it and sends it to a detector 48 which demodulates the signal and provides a DC level proportional to the magnitude of the AC signal present on electrode 40. Detector 48 drives a display device 50 in vehicle control system 14, which may be a simple d'Arsonval meter. Display device 50 serves the function of a conventional fuel meter in a gasoline operated vehicle by indicating the state of charge of battery 10.

Figure 2:
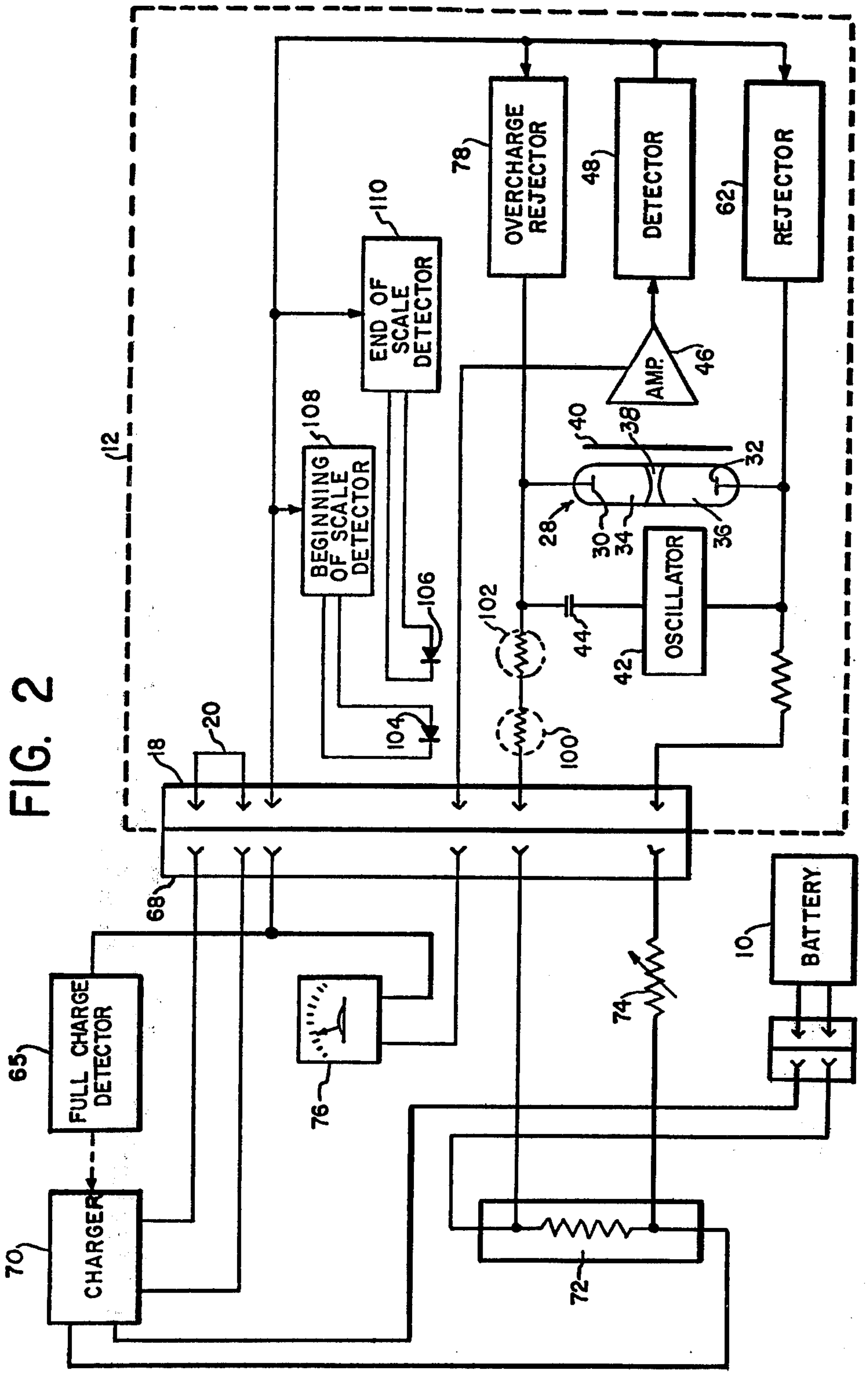
FIG. 2 is a schematic representation of an illustrative electrical power system of a charging station using the present invention.

The desired nonlinear operation is accomplished by varying the resistance of one or more controllable variable resistance devices such as photo-resistors 100 and 102. The resistance of these devices varies dependent upon the intensity of light incident upon their faces. Due to the fact that the current which advances the coulometer passes through resistors 100 and 102, an increase or decrease in their resistances results in an decrease or increase, respectively in the magnitude of the current passing into coulometer 29 with its consequent variation of the rate at which the coulometer is advanced. The resistances of resistors 100 and 102 are controlled by light emitting diodes 104 and 106, respectively. The module illustrated in FIGS. 1 and 2 is constructed in such a manner that only light from diodes 104 and 106 is incident upon the faces of the photo-resistors. Thus, when light emitting diodes 104 and 106 are excited, the rate at which coulometer 28 is advanced is changed. Such change will be dependent upon the characteristics of the resistors and their respective light emitting diodes. Light emitting diodes 104 and 106 are turned on by beginning-of-scale detector 108 and end-of-scale detector 110, respectively. Detectors 108 and 110 are simply threshold circuits which are responsive to detector 48 to turn on their respective light emitting diodes for preselected ranges in the magnitude of the output of detector 48, thereby changing the rate of integration at those preselected values.

In the preferred embodiment, the value of photoresistor 100 is low enough when excited to advance the coulometer through 50 percent of its capacity during the discharge of the first 20 percent of the battery's capacity. After a 20 percent discharge has occurred, detector 108, which initially supplies power to light emitting diode 104, is disabled, removing power from light emitting diode 104. At this point, the total value of resistances 26, 100 and 102 is such as to advance the coulometer through another 25 percent of its capacity during the discharge of another 60 percent of the battery's capacity. When the battery is storing only 20 percent of its original full charge, the voltage at the output of detector 48 triggers detector 110, activating light emitting diode 102 and again speeding up the rate of integration. The magnitude of the resistance of resistor 28 and photo-resistors 100 and 102 is such that the coulometer is advanced through the remainder of its capacity while the charge of the battery is depleted to zero. This system thus results in a state of charge display such as that illustrated in FIG. 3. It is noted that it is not necessary to use separate photo-resistors and light emitting diodes for the two expanded ranges. If the rate of integration is to be the same in both ranges, a single diode and photo-resistor may be excited to create both ranges.

The output of detector 48 is sent to a detector 52, which is a threshold device set to actuate lock-out relay 54 when detector 48 indicates that only a minimum amount of charge remains in the battery. The advent of this condition is first signaled by low charge warning circuit 55. Actuation of relay 54 opens its contacts 56, thereby removing power from auxiliary function circuits 58, such as automatic lift equipment or any other non-essential subsystems of the vehicle. However, even after this occurs, power still flows to any essential circuits 60, such as a traction motor in the vehicle, permitting the operator to return to the battery charging station to receive a new battery.

The circuitry in the module may also be provided with a deep discharge rejector 62. Rejector circuit 62 prevents electric current from resistor 26 from overdriving coulometer 28 into the nonreversible region of operation. At a threshold value before the beginning of the nonreversible region, rejector 62 is activated and passes through the coulometer a current at least as great as and opposite in direction to the current passing through variable resistor 26, thus canceling out the effect of the current passing through resistor 26, and causing the integral in the coulometer to hunt around the threshold value.

The amount of charge still remaining in each of the batteries in each of the vehicles in the system would be periodically checked, for example, at the end of each work shift. When it is desired to charge the battery, the battery and its associated module would be connected to a charging station 64 as is schematically illustrated in block diagram form in FIG. 2. This is accomplished by removing the coulometer module 12 from the vehicle and connecting it to the electrical circuit of the charging station via connectors 18 and 66. A new battery along with the coulometer module associated with that new battery would then be placed in the vehicle, while the discharged battery would be connected to and charged at the charging station.

When a depleted battery is connected to the charging station, full charge detector 68, whose input is coupled to the output of detector 48, senses that the battery is not fully charged and activates a battery charger 70, thereby charging battery 10. The charging circuit is activated by interlock loop 20 in the module and calibrated shunt 72. A variable resistor 74, which is coupled to shunt 72, samples a small amount of the current and passes it to the module and through the coulometer, thus reversing the action caused by the discharge of the battery on the distribution of mercury between the columns of mercury 34 and 36 in contact with electrodes 30 and 32 in coulometer 28. This is achieved because the flow of current through battery 10 during the charging operation is opposite that during discharge and hence the transfer of mercury through coulometer 28 is opposite the direction of transfer during discharge. Resistor 74 is adjusted to a value which causes it to accurately track the level of charge of the battery. The state of the battery during the charging operation is displayed by meter 76 which has a scale like that of meter 50 as shown in FIG. 3. When the battery is fully charged, the DC output level of detector 48 that is representative of full charge is sensed by full charge detector 68, resulting in deactivation of charger 70.

If for some reason the charger is not deactivated, an overcharge rejector 78 coupled to the output of detector 48 senses that the DC level has gone beyond that representative of full charge. Rejector 78 prevents the overdriving of coulometer 28 into a nonreversible region of operation by passing a current equal in magnitude and opposite in direction to that current provided by resistor 74 to coulometer 28.

While a particular embodiment of the invention has been illustrated, it is, of course, understood that various changes and substitutions will be obvious to those skilled in the art, such as the employment of a nonlinear integrating scheme in a system other than one which measures battery state of charge by a method other than by monitoring the current supplied by the battery. It is also contemplated that the inventive system may be used in conjunction with any integration technique where nonlinear treatment of a generated signal is desired. This would include systems where a generated signal having a nonlinear transfer function with respect to the parameter to be monitored is used. It is also noted that a number of other techniques may be substituted for the disclosed light emitting diodes and photo-resistive devices to provide the desired feedback. These devices may include simple relays, reed switches, field effect transistors and the like. Lights may be used as a display device in place of a meter, or the like. Such obvious modifications are within the purview of the invention as limited only by the appended claims.

What is claimed is:

1. Apparatus for nonlinearly integrating an electrical signal comprising:

means for integrating over an interval of time an input signal applied to said integrating means;

means coupled to said integrating means for providing during said interval an output signal that is a function of the integral of said input signal, said output signal varying over a first range;

at least one means responsive to said output signal to produce a control signal when said output signal is in a predetermined range within said first range; and at least one means responsive to said control signal for modifying said electrical signal before it is applied to said integrating means as said input signal, said modifying means being operative during said interval of integration to change the signal that is integrated when said output signal is in said predetermined range, wherein the response of the integrating means to said electrical signal is varied between that when the output signal is within said predetermined range and that when the output signal is not within said predetermined range.

2. The apparatus of claim 1 comprising a plurality of means for modifying said electrical signal, each said means operative when said output signal is in a different predetermined range, whereby the linearity of the response of the integrating means may be varied among that when the second signal is within each of said predetermined ranges and that when it is not.

3. The apparatus of claim 1 wherein the output signal is an analog function of the integral of said input signal.

4. The apparatus of claim 1 wherein the output signal is directly proportional to the integral of said input signal.

5. Apparatus for nonlinearly integrating an electrical signal comprising:

coulometer means for integrating over an interval of time an input signal applied to said coulometer means;

means coupled to said coulometer means for providing during said interval an output signal that is a function of the integral of said input signal, said output signal varying over a first range;

at least one means responsive to said output signal to produce a control signal when said output signal is in a predetermined range within said first range; and at least one means responsive to said control signal for modifying said electrical signal before it is applied to said coulometer means as said input signal, said modifying means being operative during said interval of integration to change the signal that is integrated when said output signal is in said predetermined range, wherein the response of the coulometer means to said electrical signal is varied between that when the output signal is within said predetermined range and that when the output signal is not within said predetermined range.

6. The apparatus of claim 5 comprising a plurality of means for modifying said electrical signal, each said means operative when said output signal is in a different predetermined range, whereby the linearity of the response of the integrating means may be varied among that when the second signal is within each of said predetermined ranges and that when it is not.

7. The apparatus of claim 5 wherein the output signal is an analog function of the integral of said input signal.

8. The apparatus of claim 5 wherein the output signal is directly proportional to the integral of said input signal.

9. Apparatus for nonlinearly integrating an electrical signal comprising:

means for integrating over an interval of time an input signal applied to said integrating means;

means coupled to said integrating means for providing during said interval an output signal that is a function of the integral of said input signal, said output signal varying over a first range;

at least one means responsive to said output signal for modifying said electrical signal before it is applied to said integrating means as said input signal, said modifying means being operative during said interval of integration to change the signal that is integrated when said output signal is a predetermined range within said first range, wherein the response of the integrating means to said electrical signal is varied between that when the output signal is within said predetermined range and that when the output signal is not within said predetermined range; and a display meter which is responsive to said output signal, said display meter bearing a nonlinear scale matched to the varied responses of said integrating means to said electrical signal.

10. The apparatus of claim 9 wherein said means responsive to said control signal comprises a light emitting diode to which the control signal is applied and a photoresistive device which is illuminated by said diode, said photoresistive device being a portion of a circuit that applies said electrical signal to said integrating means.

11. The apparatus of claim 9 wherein said integrating means is a coulometer.

12. Apparatus comprising:

means for integrating an input signal whose integral is related to a parameter to be measured;

means coupled to said integrating means for providing an output signal that is a function of the integral of said input signal, said output signal varying over a first range;

at least one means responsive to said output signal to produce a control signal when said output signal is in a predetermined range within said first range; and at least one means responsive to said control signal for modifying a first signal before it is applied to said integrating means as said input signal, said modifying means being operative to change the signal that is integrated when said output signal is in said predetermined range, whereby the response of the integrating means to said first signal is varied between that when the output signal is within said predetermined range and that when the output signal is not within said predetermined range.

13. The apparatus of claim 12 wherein said integrating means is a coulometer.

14. A method for nonlinearly integrating an electrical signal comprising the steps of:

integrating over an interval of time an input signal applied to an integrating means;

providing during said interval an output signal that is a function of the integral of said input signal, said output signal varying over a first range;

sensing said output signal to determine whether it has a value within a predetermined range within said first range;

producing a control signal when said output signal is in said predetermined range; and modifying said electrical signal in response to said control signal, before said electrical signal is applied to said integrating means as said input signal, to change the signal that is integrated when said output signal is in said predetermined range, wherein the response of the integrating means to said electrical signal is varied between that when the output signal is within said predetermined range and that when the output signal is not within said predetermined range.

15. A method for nonlinearly integrating an electrical signal comprising the steps of:

integrating over an interval of time an input signal applied to an integrating means;

providing during said interval an output signal that is a function of the integral of said input signal, said output signal varying over a first range;

modifying said electrical signal in response to said output signal, before said electrical signal is applied to said integrating means as said input signal, to change the signal that is integrated when said output signal is in a predetermined range within said first range, wherein the response of the integrating means to said electrical signal is varied between that when the output signal is within said predetermined range and that when the output signal is not within said predetermined range; and applying said output signal to a display means bearing a nonlinear scale matched to the varied responses of said integrating means to said electrical signal.

16. A method comprising the steps of:

integrating in an integrating means an input signal whose integral is related to a parameter to be measured;

providing an output signal that is a function of the integral of said input signal, said output signal varying over a first range;

sensing said output signal to determine whether it has a value within a predetermined range within said first range;

producing a control signal when said output signal is in said predetermined range; and modifying a first signal in response to said control signal, before said first signal is applied to said integrating means as said input signal, to change the signal that is integrated when said output signal is in said predetermined range, whereby the response of the integrating means to said first signal is varied between that when the output signal is within said predetermined range and that when the output signal is not within said predetermined range.

* * * * *